United States Patent [19]
Turunen

[11] Patent Number: 6,144,555
[45] Date of Patent: Nov. 7, 2000

[54] PROTECTIVE STRUCTURE

[75] Inventor: Timo Turunen, Kungsängen, Sweden

[73] Assignee: Telefonaktiebolaget LM Ericsson, Stockholm, Sweden

[21] Appl. No.: 09/288,623

[22] Filed: Apr. 9, 1999

[30] Foreign Application Priority Data

Apr. 9, 1998 [SE] Sweden ................................. 9801269

[51] Int. Cl.$^7$ ....................................................... H05K 7/20
[52] U.S. Cl. ........................... 361/690; 312/236; 361/814; 454/184
[58] Field of Search ..................... 62/418, 419; 454/184; 174/15.1, 16.1; 312/236; 455/347, 348; 361/690–695, 724, 814

[56] References Cited

U.S. PATENT DOCUMENTS

| | | |
|---|---|---|
| 3,858,091 | 12/1974 | Wilkinson . |
| 3,925,710 | 12/1975 | Ebert . |
| 3,956,673 | 5/1976 | Seid . |
| 4,276,752 | 7/1981 | Modler . |
| 4,535,386 | 8/1985 | Frey, Jr. . |
| 5,170,320 | 12/1992 | Pease . |
| 5,220,484 | 6/1993 | Seri . |
| 5,680,295 | 10/1997 | Le . |
| 5,801,632 | 9/1998 | Opal . |

FOREIGN PATENT DOCUMENTS

| | | |
|---|---|---|
| 0746192 A1 | 12/1996 | European Pat. Off. . |
| 97/47167 | 12/1997 | WIPO . |

*Primary Examiner*—Gerald Tolin
*Attorney, Agent, or Firm*—Burns, Doane, Swecker & Mathis, L.L.P.

[57] ABSTRACT

The present invention relates to a cabinet structure for enclosing electronic circuitry and electronic equipment. The cabinet structure includes an outer casing 60b and an inner casing 60a situated inwardly of the outer casing. The electronic circuitry/equipment has been placed within the inner casing 60a. A climate conditioning plant 80 intended for acclimatizing the atmosphere in which the electronic circuitry/equipment is situated has been placed inwardly of the outer casing but outwardly of the inner casing.

6 Claims, 3 Drawing Sheets

PROTECTIVE STRUCTURE

This application claims priority under 35 U.S.C. §§119 and/or 365 to 9801269-3 filed in Sweden on Apr. 9, 1998; the entire content of which is hereby incorporated by reference.

FIELD OF INVENTION

The present invention relates to a protective structure for housing electronic circuitry and electronic equipment.

DESCRIPTION OF THE BACKGROUND ART

Cabinets for housing electronic circuitry and equipment are used in several different fields and environments, for instance in industrial and office environments. A common feature of these various electronic equipment housing cabinets is that they are often bulky and space-consuming, regardless of the technical field in which they are used. Electronic equipment housing cabinets are often used in the field of radio technology, e.g. in the mobile telephone industry. In mobile telephony, a mobile communicates with the aid of radio signals that are sent to/received from radio base stations. Radio base stations are often situated outdoors, in a temperature and moisture environment that has a disturbing affect on the electronic circuitry and equipment. A typical method of protecting the circuitry and equipment against the influence of such external factors is to ensure that said circuitry and equipment is surrounded by a favourable climate, for instance by acclimatizing the surrounding temperature with the aid of a climate conditioning plant. This is typically achieved by placing the climate conditioning plant in a separate cabinet located adjacent the cabinet that houses the electronic circuitry and equipment. The two cabinets are placed close together and acclimatized air is transported from the climate conditioning plant to the electronic circuitry and equipment through air transits which sealingly connect the two cabinets, while air that has passed by the electronic circuitry and equipment exits to the climate conditioning plant through corresponding air transits. As before mentioned, such cabinets are bulky and the use of a further cabinet for housing the climate conditioning plant will, of course, add to the bulk by taking up more space.

SUMMARY OF THE INVENTION

The present invention addresses the problem presented by space-consuming cabinet structures that are necessary when housing climate-sensitive electronic circuitry and equipment.

The invention solves this problem by placing the electronic circuitry/equipment and the climate conditioning plant required for conditioning the climate of said circuitry and equipment in one and the same cabinet. The cabinet is comprised of a structure which includes both an outer casing and an inner casing. The electronic circuitry/equipment is placed within the inner casing and the climate conditioning plant is placed inwardly of the outer casing but outwardly of the inner casing.

One object of the present invention is to reduce the space required by climate-sensitive electronic circuitry and equipment due to the necessary, bulky operating equipment.

One advantage afforded by the present invention is that electronic circuitry/equipment housing structures according to the invention can be installed in relatively confined places.

Another advantage is that the inventive protective structure provides better protection for the electronic circuitry/equipment against the ingress of water and dust.

Another advantage is that the electronic circuitry/equipment is better protected against electromagnetic interference-EMC.

Still another advantage afforded by the invention is that unauthorised access to the electronic circuitry/equipment enclosed in the two casings can be made more difficult to achieve.

The invention will now be described in more detail with reference to preferred embodiments thereof and also with reference to the accompanying drawings.

DETAILED DESCRIPTION OF PREFERRED EMBODIMENTS

Figure 1:
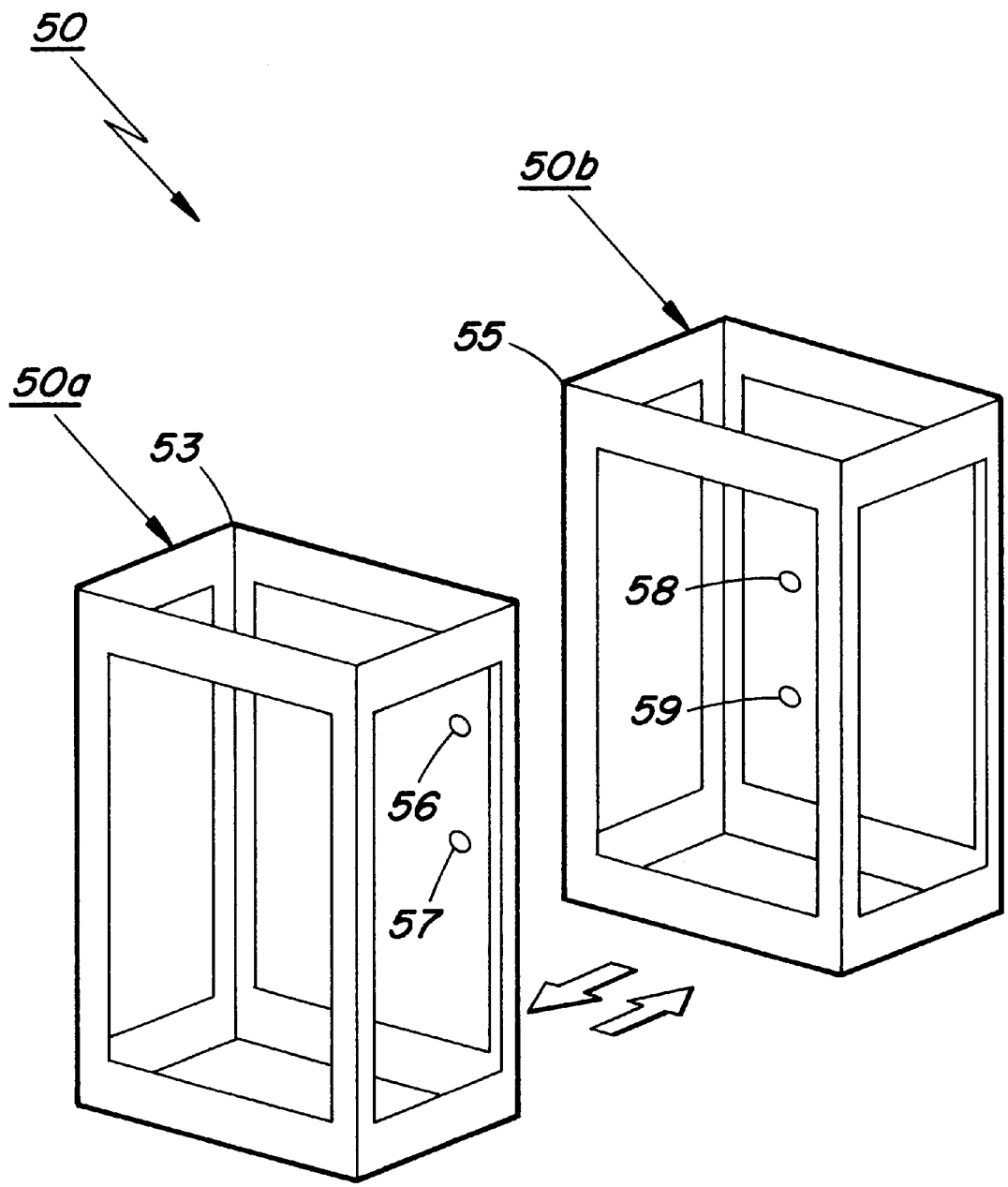
FIG. 1 is a perspective view of an earlier known cabinet structure for enclosing climate-sensitive electronic circuitry and electronic equipment.

FIG. 1 illustrates a known cabinet assembly 50 for housing radio base stations. The illustrated assembly includes two cabinets 50a and 50b, each of which comprises a cubical aluminium frame-work 53 and 55. In addition to the frame-work, the two cabinets include a number of sheet-metal panels fastened to the sides, the top and the bottom of respective frame-works. The panels are fastened with the aid of screws or rivets, for instance. Each of the two cabinets 50a and 50b includes a door. The doors, panels and cabinet fasteners have not been shown in FIG. 1, for the sake of simplicity.

The cabinet assembly is intended to house climate-sensitive electronic circuitry and equipment. In the assembled state of the cabinet structure, the electronic circuitry of the radio base station is located in the first cabinet 50a in the region defined by the frame-work 53. The second cabinet in the erected cabinet structure will include a climate conditioning plant. The climate conditioning plant is required to maintain the electronic circuitry at the correct temperature and to maintain the correct air humidity in the first cabinet. The two cabinets are joined together in the direction of the solid arrows, when assembling the cabinet structure. Each of the cabinets 50a and 50b include two holes 56, 57 and 58, 59 respectively. Rubber bushes or like seals (not shown in FIG. 1) are fitted between the cabinets in the proximity of the holes. The upper holes 56 and 58 in respective cabinets 50a, 50b form one pair of holes, while the bottom holes 57 and 59 in respective cabinets form another pair of holes. Each pair of holes 56, 58 and 57, 59 have seals fitted therebetween. The erected cabinet structure therewith includes sealed air transits formed by said hole pairs. One pair of holes 56, 58 in the assembled cabinets forms a passageway for acclimatized air from the climate conditioning plant to the electronic circuitry/equipment. The second pair of holes 57, 59 in the interconnected cabinets form a passageway for spent air from the electronic circuitry/equipment to the climate conditioning plant. When the cabinet structure has been erected so as to include an electronic circuitry housing cabinet and a cabinet for housing the climate conditioning plant, air will circulate from/to the climate conditioning plant and to/from the electronic circuitry/equipment when said climate conditioning plant is in an operating mode. This conventional cabinet structure will now be compared with a cabinet that is constructed in accordance with the present invention, i.e. a cabinet structure that requires less space than the aforedescribed known structure.

Figure 2:
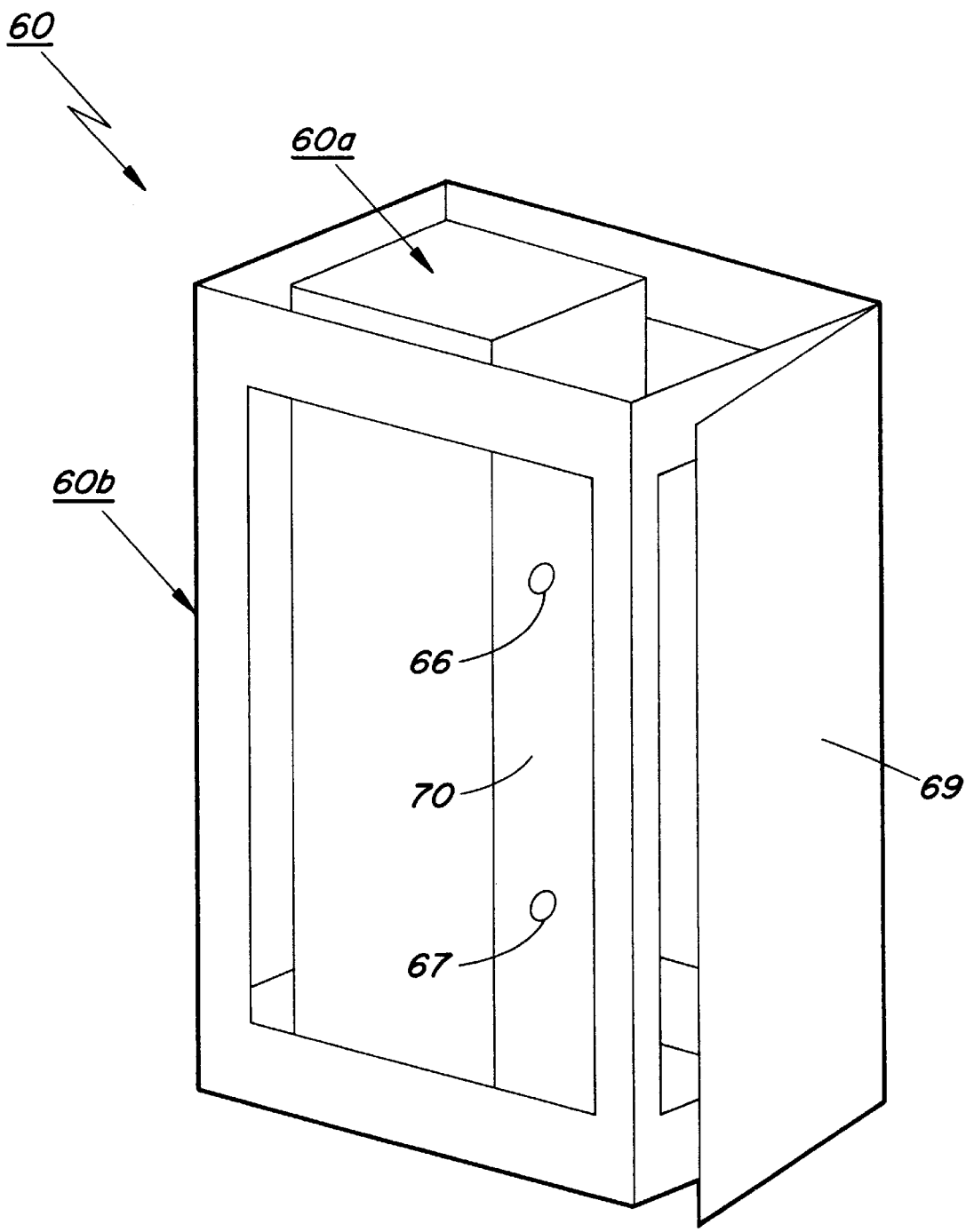
FIG. 2 is a perspective view of an inventive structure for enclosing climate-sensitive electronic circuitry and electronic equipment.

FIG. 2 illustrates an inventive cabinet structure 60. The cabinet structure houses a radio base station and includes an outer casing 60b which, similar to the cabinet 50a described above with reference to FIG. 1, includes a frame-work to which sheet-metal panels are fitted. The outer casing includes an outer door 69, which is open in the schematic illustration. The cabinet structure also includes an inner casing 60a. The inner casing houses the electronic circuitry/equipment of the radio base station and includes a door 70, which is closed in the FIG. 2 illustration. The outer casing houses a climate conditioning plant outwardly of the inner casing. Neither the electronic circuitry/equipment nor the climate conditioning plant have been shown in FIG. 2, but will be explained in more detail with reference to FIG. 3 hereinafter. The inner casing includes air transits 66 and 67, through which air is able to circulate between the climate conditioning plant and the electronic circuitry/equipment. This circulation will also be explained in more detail with reference to FIG. 3.

Figure 3:
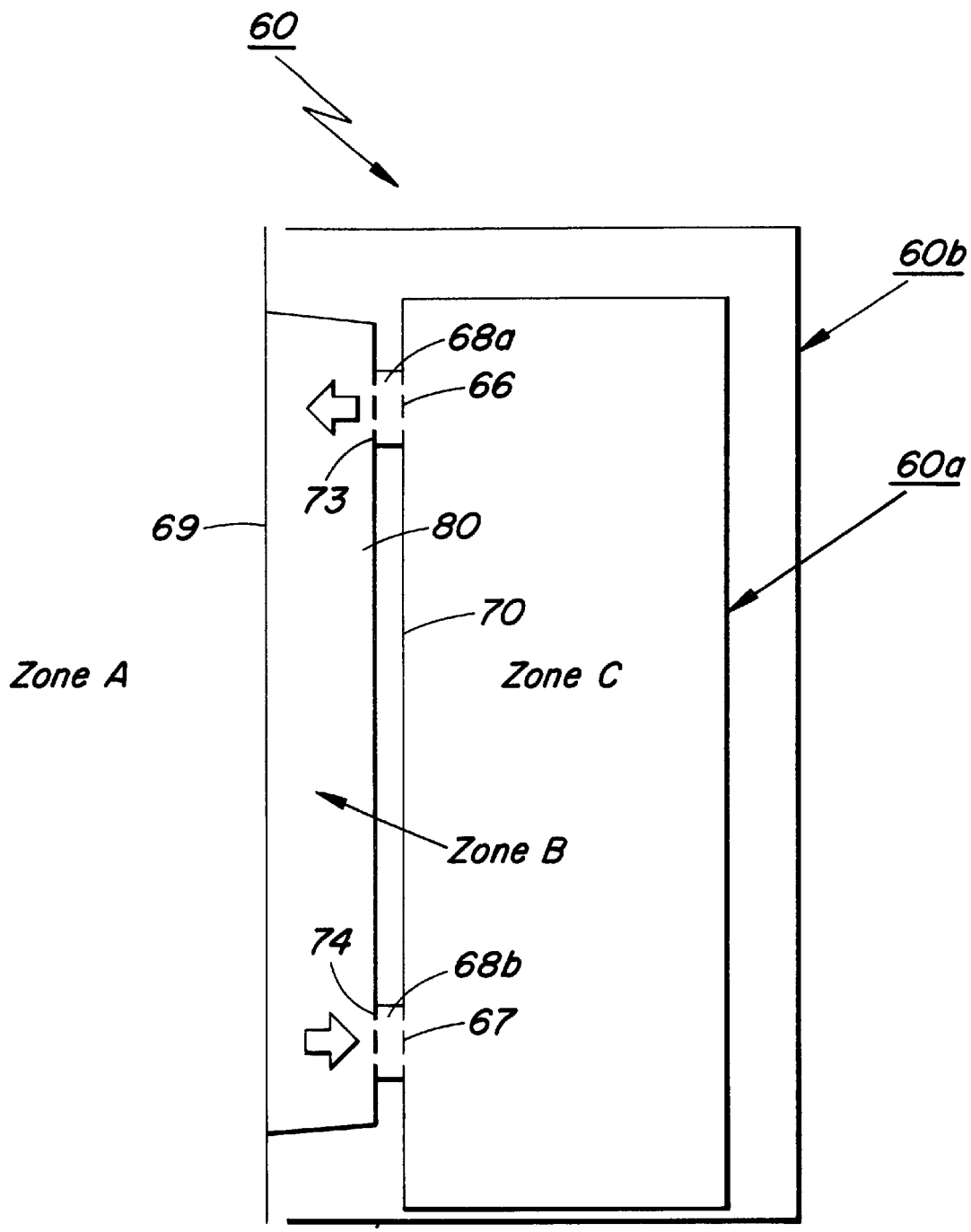
FIG. 3 is a side view of an inventive structure.

FIG. 3 is a schematic sectional side view of the cabinet structure 60 shown in FIG. 2 and illustrates both the outer casing 60b and the inner casing 60a. The illustrated structure also includes the outer door 69 and shows a climate conditioning plant 80 mounted on the inside of said door. The climate conditioning plant 80 may be sub-divided to facilitate maintenance and functions to ensure that the electronic circuitry/equipment housed in the cabinet will be exposed to suitable temperature and climate conditions. The electronic circuitry/equipment (not shown) is located within the inner casing 60a.

A wall 70 is provided between the climate conditioning plant 80 and the electronic circuitry/equipment. This wall includes an inner door through which the electronic circuitry/equipment can be accessed, for instance to carry out repairs. In the case of the illustrated embodiment, the inner door can be locked so that only authorised personnel can obtain access to the more sophisticated equipment. The electronic circuitry/equipment is located in the cabinet within the area marked "Zone C" in FIG. 3, while the climate conditioning plant is located in the area marked "Zone B" in FIG. 3. Zone B is an antechamber in which the climate conditioning plant and diverse connections are located. The antechamber constitutes a coarse entrance to an inner chamber that constitutes Zone C. Radio parts and other electronic circuitry/equipment are located in the inner chamber. Zone A in FIG. 3 is an area outside the cabinet. The wall situated between electronic circuitry/equipment and the climate conditioning plant forms an hermetic closure between said plant 80 and said Zone C. Provided on the side of the climate conditioning plant that lies proximal to said wall are two rubber bushes 68a, 68b in the proximity of two holes 73 and 74 in the climate conditioning plant. When the door is closed, the bushes lie in sealing abutment with the wall in the proximity of the two holes 66 and 67 in the partition wall.

When the climate conditioning plant is in an operating mode, acclimatized air is circulated from the climate conditioning plant through the hole 67 into Zone C, and returns to the climate conditioning plant through the hole 66 as illustrated by the hollow arrows. This mutual separation of the coarse entrance and the chamber housing the electronic circuitry/equipment with the aid of a partition wall means that only controlled air will circulate in the 30 radio-housing chamber. Rain, water condensate or other water will not reach the radio-housing chamber from the climate conditioning plant, since the inner casing 60a functions as a barrier to the ingress of such water. The cables connected to the electronic circuitry/equipment have not been shown in the 35 Figure, these cables being placed on the side of the inner casing that lies proximal to the outer door. The inventive cabinet structure 60 shown in FIG. 3 provides the desired effect and significantly reduces the bottom area of the structure in comparison with the aforedescribed conventional structure.

It will be understood that the invention is not restricted to the aforedescribed and illustrated exemplifying embodiments thereof and that modifications can be made within the scope of the accompanying Claims.

What is claimed is:

1. A cabinet structure for enclosing electronic circuitry and electronic equipment including an outer casing (60b) having a door and an inner casing (60a) inwardly of said outer casing, characterised in that the inner casing (60a) houses the electronic circuitry/equipment; and in that the outer casing (60b) houses inwardly thereof but outwardly of the inner casing (60a) a climate conditioning plant (80) for acclimatizing the atmosphere in which the electronic circuitry/equipment is situated; and in that the inner casing (60a) includes sealed air transits through which air can pass from the climate conditioning plant (80) to the electronic circuitry/equipment and from said electronic circuitry/equipment back to said climate conditioning plant (80); and in that the side of the inner casing (60a) that lies proximal to the outer door includes an inner door which provides access to the electronic circuitry/equipment.

2. A cabinet structure according to claim 1, characterised in that the outer casing (60b) includes at least one outer door, the inside surface of which carries said climate conditioning plant.

3. A cabinet structure according to claim 1, characterised in that the inner door is lockable.

4. A cabinet structure according to claim 1, characterised in that the side of the inner casing proximal to the outer door carries a connection panel for cables leading to the casing that houses said electronic circuitry/equipment.

5. A cabinet structure according to claim 1, characterised in that at least one of the casings (60a, 60b) is made of aluminium.

6. A cabinet structure according to claim 1, characterised in that at least one of the casings (60a, 60b) is made of sheet metal.

* * * * *